US010482953B1

(12) United States Patent
Lin et al.

(10) Patent No.: US 10,482,953 B1
(45) Date of Patent: Nov. 19, 2019

(54) MULTI-STATE MEMORY DEVICE AND METHOD FOR ADJUSTING MEMORY STATE CHARACTERISTICS OF THE SAME

(71) Applicant: MACRONIX INTERNATIONAL CO., LTD., Hsinchu (TW)

(72) Inventors: Yu-Hsuan Lin, Taichung (TW); Yu-Yu Lin, New Taipei (TW); Feng-Min Lee, Hsinchu (TW); Chao-Hung Wang, Tainan (TW); Po-Hao Tseng, Taichung (TW); Kai-Chieh Hsu, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/103,022

(22) Filed: Aug. 14, 2018

(51) Int. Cl.
*G11C 11/56* (2006.01)
*H01L 27/22* (2006.01)
*H01L 27/24* (2006.01)

(52) U.S. Cl.
CPC ...... *G11C 11/5657* (2013.01); *G11C 11/5607* (2013.01); *G11C 11/5678* (2013.01); *G11C 2211/562* (2013.01); *H01L 27/228* (2013.01); *H01L 27/2436* (2013.01)

(58) Field of Classification Search
CPC ............ G11C 11/5657; G11C 11/5607; G11C 11/5678; G11C 2211/562; H01L 27/228; H01L 27/2436

USPC .......................................................... 365/148
See application file for complete search history.

(56) References Cited

U.S. PATENT DOCUMENTS

| 10,163,478 B2 * | 12/2018 | Jung ..................... G11C 11/161 |
| 10,283,184 B2 * | 5/2019 | Kim .................. H01L 29/78391 |
| 2019/0019551 A1 * | 1/2019 | Lee ..................... G11C 11/5657 |
| 2019/0172502 A1 * | 6/2019 | Jeong ..................... G11C 5/063 |

* cited by examiner

*Primary Examiner* — Fernando Hidalgo
(74) *Attorney, Agent, or Firm* — McClure, Qualey & Rodack, LLP

(57) ABSTRACT

A multi-state memory device includes a first memory element, a second memory element, a first controlling element and a second controlling element. The second memory element has a memory cell structure identical to that of the first memory element and connects to the first memory element in series. The first controlling element is connected to the first memory element either in series or in parallel. The second controlling element has a characteristic value identical to that of the first controlling element and is connected to the second memory element by a connection structure identical to that of the first controlling element. When the first memory element receives a first signal and a second signal through the first controlling element, a first state value and a second state value are generated correspondingly, and the characteristic value is greater than the first state value and less than the second state value.

21 Claims, 11 Drawing Sheets

MULTI-STATE MEMORY DEVICE AND METHOD FOR ADJUSTING MEMORY STATE CHARACTERISTICS OF THE SAME

BACKGROUND OF THE INVENTION

Field of the Invention

The invention relates in general to a non-volatile memory (NVM), and more particularly to a multi-state memory device and the method for adjusting the memory state characteristics of the same.

Description of the Related Art

NVMs which can continually store information even when the supply of electricity is removed from the device containing the NVM cells. Recently, the most widespread used NVMs are charge trap flash (CTF) memory devices. However, as semiconductor features shrink in size and pitch, the CTF memory devices have its physical limitation of operation.

Multi-state memory devices are the memory devices using a plurality of pulses with different voltages to stimulate the memory cells generating a plurality of electrical characteristics to respectively designate the memory states thereof. To take a resistive memory device, such as a resistive random-access memory (ReRAM) device, as an example, when a plurality of pulses with different voltages are applied to the ReRAM device, difference of resistance resulted from the pulses with different voltages can be used to respectively designate as "0" or "1" states of the memory cells thereof for implementing the erase/program operation. Since the multi-state memory devices have advantages in terms of cell area, device density, power consumption, programming/erasing speed, three-dimensional integration, multi-value implementation, and the like over flash memory devices, thus have become a most promising candidate for leading products in the future memory market.

However, the memory-state characteristics distribution of the memory elements constituting the multi-state memory device may be different from each other, due to the process variation and dimensional tolerance; and this may lead to the results that the memory-states of the memory elements cannot be precisely identified when an identical signal is received by these memory elements of the multi-state memory device, and thus causing the operation reliability of the multi-state memory device deteriorated.

Therefore, there is a need of providing an improved multi-state memory device the method for adjusting the memory state characteristics of the same to obviate the drawbacks encountered from the prior art.

SUMMARY OF THE INVENTION

According to one aspect of the present disclosure, a multi-state memory device is disclosed, wherein the multi-state memory device includes a first memory element, a second memory element, a first controlling element and a second controlling element. The second memory element has a memory cell structure identical to that of the first memory element and connects to the first memory element in series. The first controlling element is connected to the first memory element either in series or in parallel. The second controlling element has a characteristic value identical to that of the first controlling element and is electrically connected to the second memory element by a connection structure identical to that of the first controlling element. When the first memory element receives a first signal and a second signal through the first controlling element respectively, a first state value and a second state value are generated correspondingly, and the characteristic value is greater than the first state value and less than the second state value.

According to another aspect of the present disclosure, a method for adjusting memory-state characteristics of a multi-state memory device is disclosed, wherein the method includes steps as follows: Firstly, a first memory element and a second memory element are provided, wherein the second memory element has a memory cell structure identical to that of the first memory element and connects to the first memory element in series. A first controlling element is provided to connect the first memory element either in series or in parallel. A second controlling element having a characteristic value identical to that of the first controlling element is provided, wherein the second controlling element is electrically connected to the second memory element by a connection structure identical to that of the first controlling element. When the first memory element receives a first signal and a second signal through the first controlling element respectively, a first state value and a second state value are generated correspondingly, wherein the characteristic value is greater than the first state value and less than the second state value.

In accordance with the embodiments of the present disclosure, a multi-state memory device and the method for adjusting the memory state characteristics of the same are provided. Each of the memory elements (memory cells) disposed in the same cell string of the multi-state memory device is electrically connected to a controlling element either in series or in parallel for adjusting the memory-state characteristics generated by the different memory elements to respond an identical signal received by the memory elements, whereby, the variation of the memory-state characteristics can be reduced, and the storage states of the multi-state memory device can be thus precisely identified.

In some embodiments of the present disclosure, the memory-state characteristics may be the resistance, the conductance or the threshold voltage (Vth) of the memory elements. The controlling elements can be resistors with a stable resistance or switches having a stable Vth; and the type of the controlling elements can be determined depending upon the selection of the memory-state characteristics. The connection mode (series or parallel) of the memory elements and the corresponding controlling elements can be selected according to the type, application range, and operation signal of the multiple-state memory device.

For example, in some embodiments of the present disclosure, when the resistance difference of each memory element is designated as the memory-state (e.g. "0" or "1" states) of the memory element for implementing the erase/program operation, a resistor with a stable resistance can be used to serve as the controlling element of the multi-state memory. Each of the memory elements can be connected to one resistor in series for reduce the variation of the conductance (serving as the memory-state characteristics) measured from these memory elements of the multi-state memory in a low resistance state when receiving a constant-voltage as an operation signal. Each of the memory elements can be connected to one resistor in parallel for reduce the variation of the resistance (serving as the memory-state characteristics) measured from these memory elements of the multi-state memory in a high resistance state when receiving a constant-current as an operation signal.

In some embodiments of the present disclosure, when the Vth of each memory element is designated as the memory-state (e.g. "0" or "1" states) of the memory element for implementing the erase/program operation, a switch having a stable Vth can be used to serve as the controlling element of the multi-state memory device. Each of the memory elements can be connected to one switch in series for reduce the variation of the Vths (serving as the memory-state characteristics) measured from these memory elements of the multi-state memory device in a lower Vth state. Each of the memory elements can be connected to one switch in parallel to reduce the variation of the Vths (serving as the memory-state characteristics) measured from these memory elements of the multi-state memory device in a high Vth state.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1:
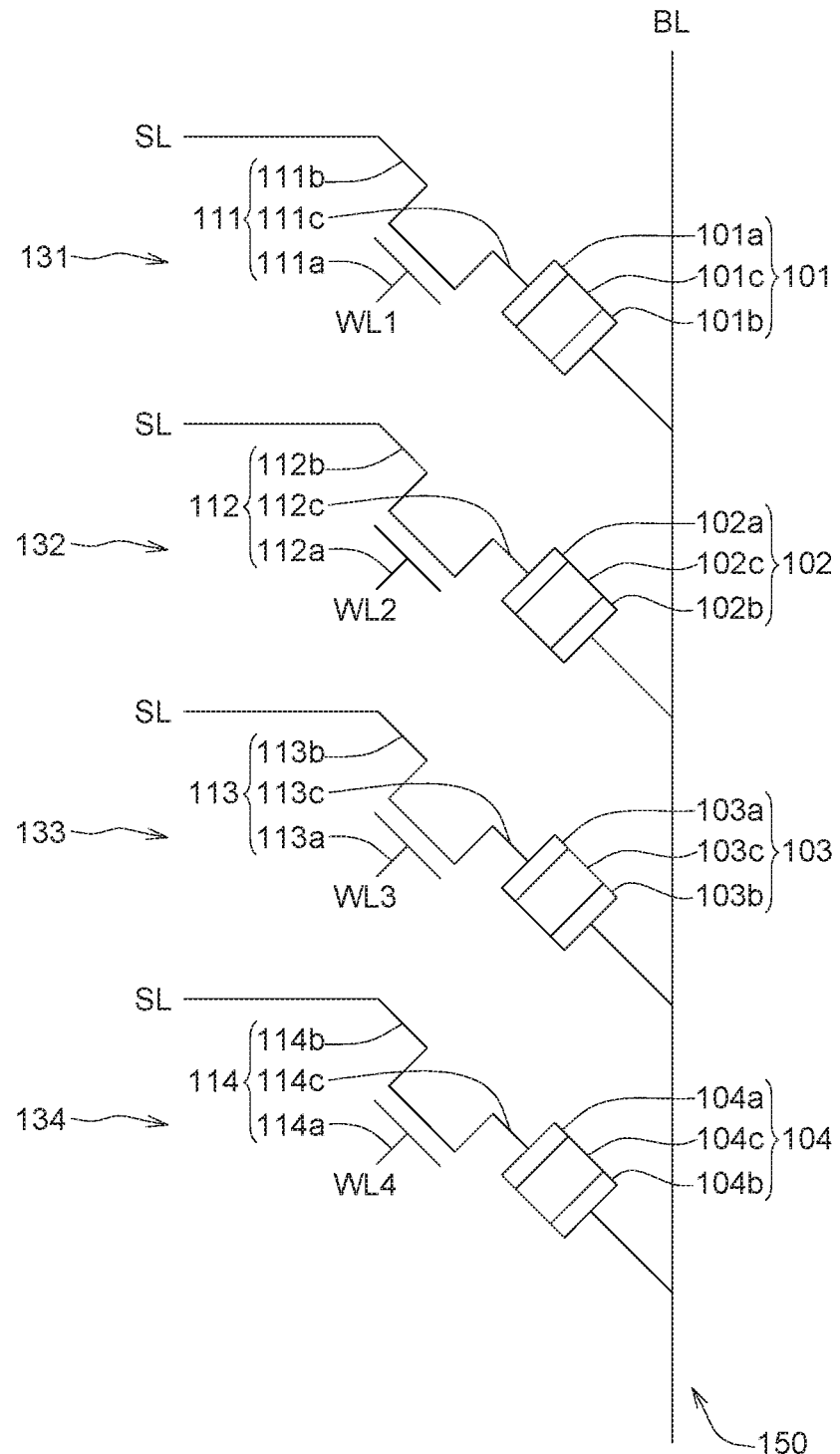
FIG. 1 is a block diagram illustrating a multi-state memory device in accordance with one embodiment of the present disclosure.

A multi-state memory device the method for adjusting the memory state characteristics of the same are provided to precisely identified the memory-states of the memory elements disposed in the multi-state memory device and improve the operation reliability thereof. Several embodiments of the present disclosure are disclosed below with reference to accompanying drawings.

However, the structure and contents disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the invention will be able to make suitable modifications or changes based on the specification disclosed below to meet actual needs without breaching the spirit of the invention. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

FIG. 1 is a block diagram illustrating a multi-state memory device 100 in accordance with one embodiment of the present disclosure. The multi-state memory device 100 includes a plurality of memory elements 101-104 with an identical structure and a plurality of selecting switches 111-114 with an identical structure. Each of the memory elements 101-104 is connected to one of the selecting switches 111-114 to form a memory cell (such as one of the memory cells 131-134) respectively. These memory cells 131-134 are connected between a bit line BL and a common source line SL to form a cell string 150. It should be appreciated that although the cell string 150 as shown in FIG. 1 merely includes 4 memory cells 131-134 (memory elements 101-104), but the number of the memory cells (memory elements) involved in a cell string may not be limited to this regard. In some other embodiment, the cell string 150 may include more or less memory cells (memory elements).

For example, in the present embodiment, the memory element 101 is connected to the selecting switch 111 in series to form the memory cell 131; the memory element 102 is connected to the selecting switch 112 in series to form the memory cell 132; the memory element 103 is connected to the selecting switch 113 in series to form the memory cell 133; and the memory element 104 is connected to the selecting switch 114 in series to form the memory cell 134. In an embodiment, the multi-state memory device 100 is constituted by a AND-type array, and the memory cell 131, the memory cell 132, the memory cell 133 and the memory cell 134 are connected in parallel between the bit line BL and the common source line SL.

The memory elements 101-104 may be the memory cells which can use the resistance measured there from to serve as its memory-state values (designate as "0" or "1" states of the memory cells). In some embodiments of the present disclosure, each of the memory elements 101-104 can be a resistive random-access memory (ReRAM), a phase change memory (PCM), a magnetic random-access memory (MRAM) or a spin-transfer torque random-access memory (STT-RAM).

In the present embodiment, the memory elements 101-104 can be 4 ReRAM cells. The memory element 101 includes a top electrode 101a connected to the selecting switch 111, a bottom electrode 101b connected to the bit line BL and a transition metal layer 101c connecting between the top electrode 101a and the bottom electrode 10113; the memory element 102 includes a top electrode 102a connected to the selecting switch 112, a bottom electrode 102b connected to the bit line BL and a transition metal layer 102c connecting between the top electrode 102a and the bottom electrode 102b; the memory element 103 includes a top electrode 103a connected to the selecting switch 113, a bottom electrode 103b connected to the bit line BL and a transition metal layer 103c connecting between the top electrode 103a and the bottom electrode 103b; and the memory element 104 includes a top electrode 104a connected to the selecting switch 114, a bottom electrode 104b connected to the bit line BL and a transition metal layer 104c connecting between the top electrode 104a and the bottom electrode 104b.

In some embodiments of the present disclosure, each of the selecting switches 111-114 may be a transistor, a diode or as selector. In the present embodiment, the selecting switches 111-114 can be made of a metal-oxide-semiconductor field-effect transistor (MOSFET). The selecting switch 111 includes a gate electrode 111a connected to a word line WL1, a source electrode 111b connected to a common source line SL and a drain electrode 111c connected to the top electrode 101a of the memory element 101; the selecting switch 112 includes a gate electrode 112a connected to a word line WL2, a source electrode 112b connected to the common source line SL and a drain electrode 112c connected to the top electrode 102a of the memory element 102; the selecting switch 113 includes a gate electrode 113a connected to a word line WL3, a source electrode 113b connected to the common source line SL and a drain electrode 113c connected to the top electrode 103a of the memory element 103; and the selecting switch 114 includes a gate electrode 114a connected to a word line WL4, a source electrode 114b connected to the common source line SL and a drain electrode 114c connected to the top electrode 104a of the memory element 104.

Figure 2A:
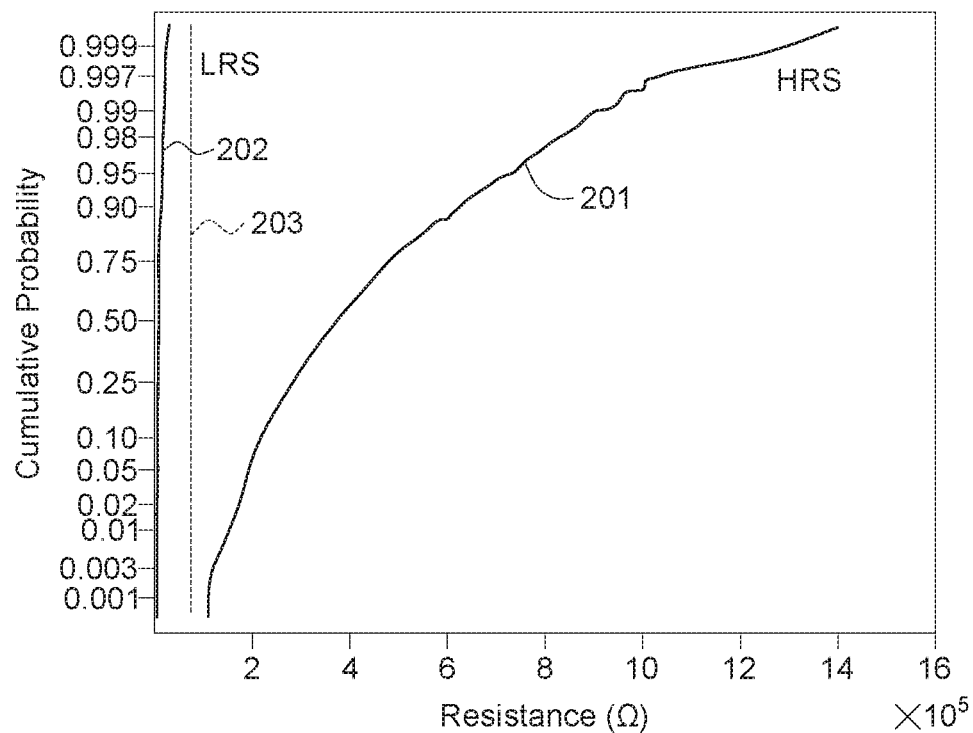
FIG. 2A is a diagram illustrating a resistance cumulative distribution function (CDF) of a single memory element constituting the multi-state memory device as depicted in FIG. 1 after the memory cells of the multi-state memory device are programmed by respectively receiving a first signal with a higher voltage and a second signal with a lower voltage and the resistance of the programmed memory cells are read by receiving a read signal with a fix pulse.
Figure 2B:
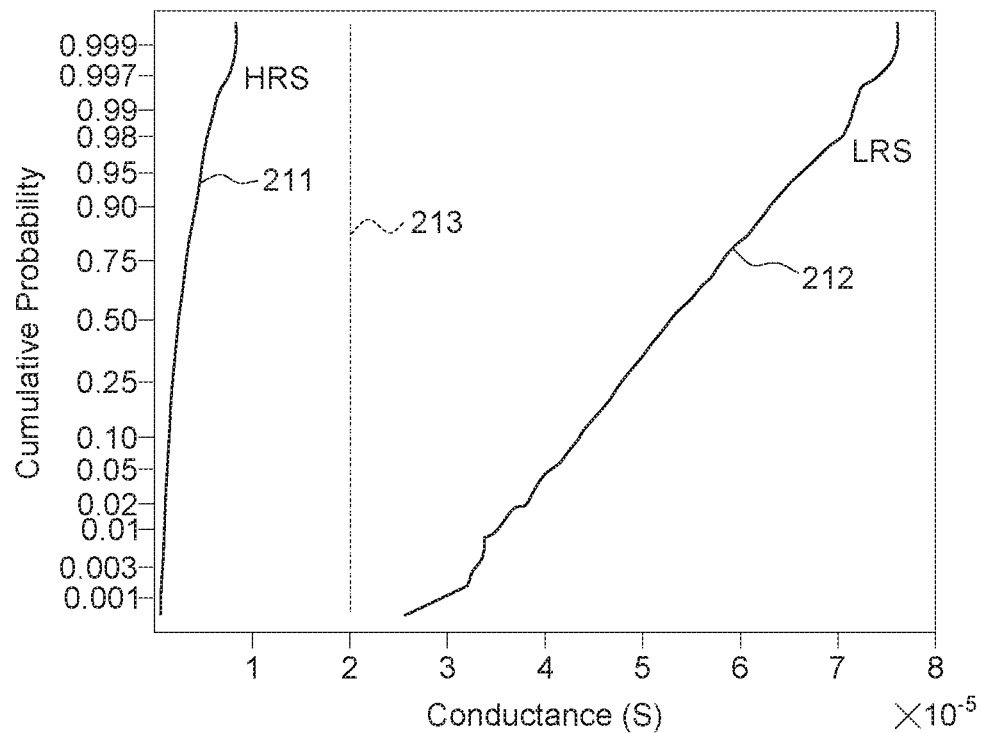
FIG. 2B is a diagram of a conductance CDF depicted according to the data shown in FIG. 2A.

FIG. 2A is a diagram illustrating a resistance cumulative distribution function (CDF) of a single memory element (such as the memory element 101) constituting the multi-state memory device 100 as depicted in FIG. 1 after the memory cells 131-134 are programmed by respectively receiving a first signal with a higher voltage and a second signal with a lower voltage and the resistance of the programmed memory cells 131-134 are read by receiving a read signal with a fix pulse. FIG. 2B is a diagram of a conductance CDF depicted according to the data shown in FIG. 2A. The horizontal axis of FIG. 2A indicates the resistance of the memory element 101 and the vertical axis indicates the cumulative number of the memory element 101. The horizontal axis of FIG. 2B indicates the conductance of the memory element 101 and the vertical axis indicates the cumulative number of the memory element 101.

The curves 201 and 202 as shown in FIG. 2A respectively represent the resistance cumulative distribution of the memory element 101 after subjected to a first signal with a higher voltage and a second signal with a lower voltage. The curves 211 and 212 as shown in FIG. 2B respectively represent the conductance cumulative distribution of the memory element 101 corresponding to the curves 201 and 202 of FIG. 2A. The resistance cumulative distribution of the memory element 101 may locate in a higher resistance area HRS (see the curve 201) and its conductance cumulative distribution may locate in a lower conductance area (see the curve 211) after subjected to a higher voltage. Alternatively, the resistance cumulative distribution of the memory element 101 may locate in a lower resistance area LRS (see the curve 202) and its conductance cumulative distribution may locate in a higher conductance area (see the curve 212) after subjected to a lower voltage. There is a gap separating the lower resistance area from the higher resistance area; and there is a gap separating the lower conductance area from the higher conductance area. The state of the memory element 101 can be obtained by determining whether the resistance (conductance) thereof is greater than a predetermined critical resistance 203 (conductance 213) with in the gap can be utilized to indicate digital signal (i.e. "0" or "1"), thereby allowing for data storage.

According to FIGS. 2A and 2B, it can be found that the resistance variation (distributing in the range from $1.5 \times 10^5$ Ohm ($\Omega$) to $1.4 \times 10^6 \Omega$) of the memory element 101 located in the higher resistance area HRS is greater than the resistance variation (distributing in the range from $0 \Omega$ to $5 \times 10^4 \Omega$) located in the lower resistance area LRS, and the conductance variation (distributing in the range from 0 S to $9 \times 10^{-6}$ S) of the memory element 101 located in the higher resistance area HRS is less than the conductance variation (distributing in the range from 2.5×10-5 S to $7.5 \times 10^{-5}$ S) located in the lower resistance area LRS.

However, the resistance (conductance) variation among the memory elements 101-104 may be different from each other (in some cases they may have inverse characteristics), due to the process variation and dimensional tolerance; and this may lead to the results that the memory-states of the memory elements 101-104 cannot be precisely identified when an identical signal is received by (an identical voltage pulse applied on) these memory elements 101-104 of the multi-state memory device 100, and thus causing the operation reliability of the multi-state memory device 100 deteriorated.

The problems may get worse when the multi-state memory device 100 is applied to perform a neuromorphic computing using non-volatile memory. For example, when a plurality of memory elements disposed in several different cell strings 150a-150e of the multi-state memory device 100 are subjected to an identical voltage pulse, and the resistance (conductance) measured from the memory elements disposed in the same cell string, such as the cell string 150a, are sum up to produce a sum resistance CDF (a sum conductance CDF). However, the sum resistance CDFs (sum conductance CDFs) of the cell strings 150a-150e may have a more difference, due to the variety of the resistance (conductance) variation among the memory elements.

Figure 3:
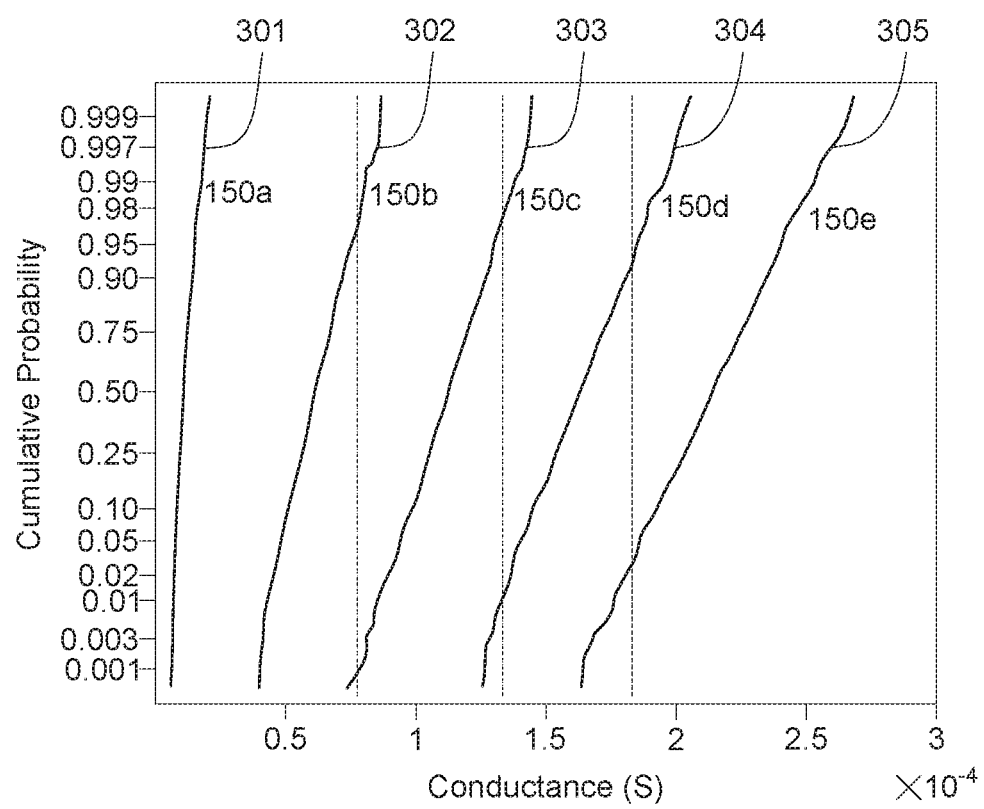
FIG. 3 is a diagram of illustrating sum conductance CDFs of plural cell strings constituted by the memory elements of the multi-state memory device as depicted in FIG. 1 after the memory elements are programmed by receiving an identical voltage pulse and the resistance of the programmed memory elements are read by receiving a read signal with a fix pulse.

FIG. 3 is a diagram of illustrating sum conductance CDFs of plural cell strings 150a-150b constituted by the memory elements 101-104 of the multi-state memory device 100 as depicted in FIG. 1 after the memory elements 101-104 are programmed by receiving an identical voltage pulse and the resistance of the programmed memory elements 101-104 are read by receiving a read signal with a fix pulse, wherein these memory elements may merely have identical structures but different memory-state characteristics. The curves 301-305 as shown in FIG. 3 respectively represent the sum conductance cumulative distribution of the cell strings 150a-150e.

For example, in the present embodiment, the 4 memory elements 101-104 disposed in the cell string 150a may all have the memory state characteristics (the resistances of the memory elements 101-104) with the resistance variation located in the higher resistance area HRS greater than that located in the lower resistance area LRS. 3 (such as the memory elements 101-103) of the 4 memory elements 101-104 disposed in the cell string 150b have the memory state characteristics with the resistance variation located in the higher resistance area HRS greater than that located in the lower resistance area LRS; and the other one (such as the memory element 104) of the 4 memory elements 101-104 has the memory state characteristic with the resistance variation located in the higher resistance area HRS less than that located in the lower resistance area LRS. 2 (such as the memory elements 101-102) of the 4 memory elements 101-104 disposed in the cell string 150c have the memory state characteristics with the resistance variation located in the higher resistance area HRS greater than that located in the lower resistance area LRS; and the other 2 (such as the memory elements 103-104) of the 4 memory elements 101-104 have the memory state characteristics with the resistance variation located in the higher resistance area HRS less than that located in the lower resistance area LRS. One (such as the memory element 101) of the 4 memory elements 101-104 disposed in the cell string 150d has the memory state characteristic with the resistance variation located in the higher resistance area HRS greater than that located in the lower resistance area LRS; and the other 3 (such as the memory elements 102-104) of the 4 memory elements 101-104 have the memory state characteristics with the resistance variation located in the higher resistance area HRS is less than that located in the lower resistance area LRS. The 4 memory elements 101-104 disposed in the cell string 150e may all have the memory state characteristics with the resistance variation located in the higher resistance area HRS less than that located in the lower resistance area LRS.

According to FIG. 3, it can be found that except the cell string 150a (see the curve 301), the sum conductance cumulative distribution curves 302 to 305 of the cell strings 150b-150e may extend within quite a large area, and each two of them may overlap to each other. There is no gap for separating each two of these curves 302 to 305, and no critical conductance can be determined to indicate different memory-states (i.e. "0" or "1") allowing for data storage.

Figure 4:
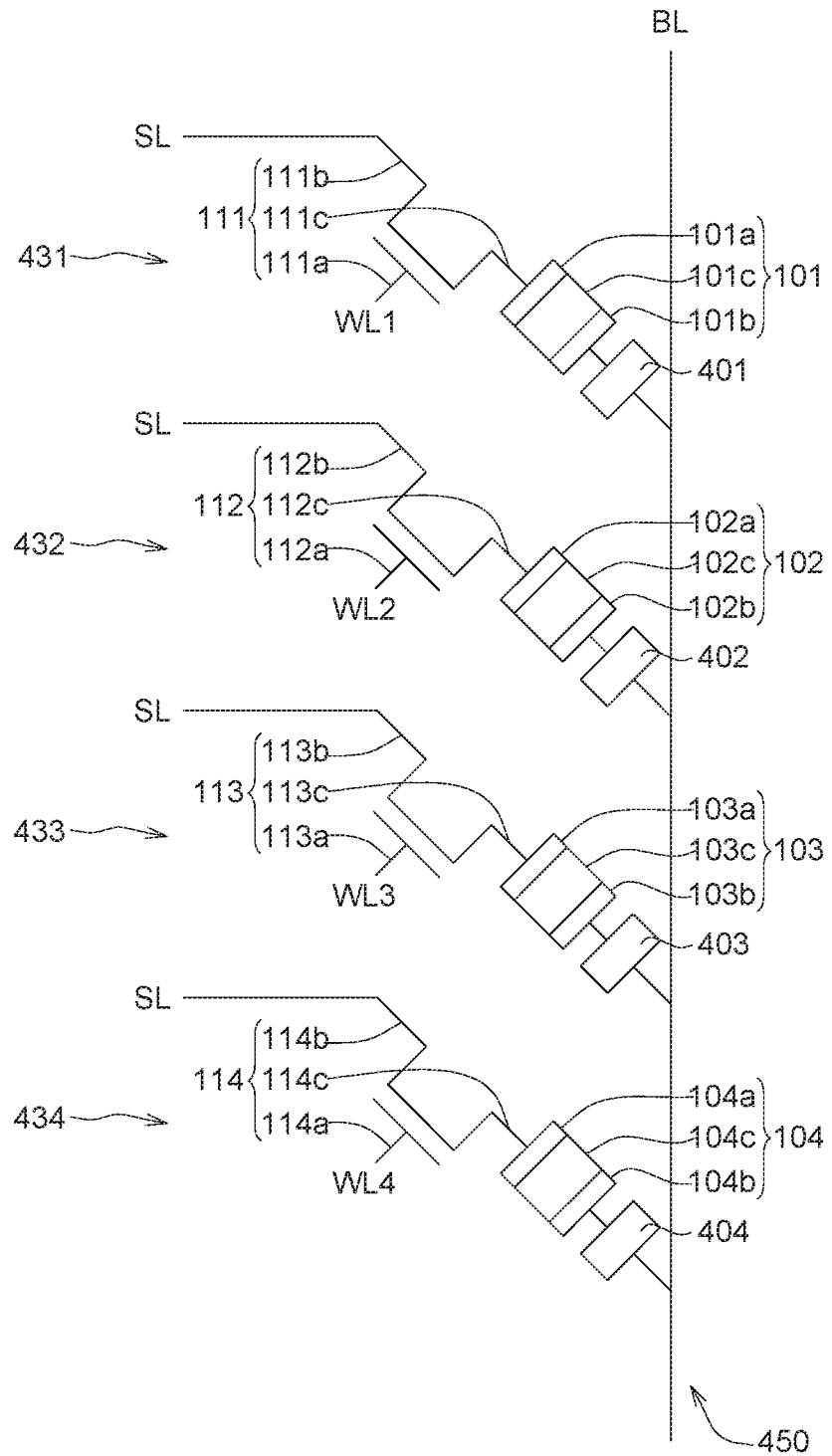
FIG. 4 is a block diagram illustrating a multi-state memory device in accordance with another embodiment of the present disclosure.

To solve the problems, another multi-state memory device 400 is provided. FIG. 4 is a block diagram illustrating a multi-state memory device 400 in accordance with another embodiment of the present disclosure. The structure of the multi-state memory device 400 is similar to that of the multi-state memory device 100 as shown in FIG. 1, except that the multi-state memory device 400 further includes a plurality of controlling elements 401-404, wherein each of the memory elements 101-104 is corresponding to and connected to one of the controlling elements 401-404 in series.

In the present embodiment, the memory element 101, the selecting switch 111 and the controlling element 401 are connected in series to form a memory cell 431; the memory element 102, the selecting switch 112 and the controlling element 402 are connected in series to form a memory cell 432; the memory element 103, the selecting switch 113 and the controlling element 403 are connected in series to form a memory cell 433; and the memory element 104, the selecting switch 114 and the controlling element 404 are connected in series to form a memory cell 434. These memory cells 431-434 are connected between a bit line BL and the common source line SL to form a cell string 450.

In some embodiments of the present disclosure, each of the controlling elements 401-404 can be made of an electric device (e.g. a transistor, a resistor or a memory device), a parasitic element (e.g. a doped area within a semiconductor substrate) or an insulation structure (e.g. a dielectric structure made of silicon oxide) that can provide a stable resistance. In the present embodiment, each of the controlling elements 401-404 can be a resistor made of doped polysilicon, and the controlling elements 401-404 have an identical resistance (also referred to as a characteristic value).

One end of the controlling element 401 is connected to the bottom electrode 101b of the memory element 101; and the other end of the controlling element 401 is connected to the bit line BL. One end of the controlling element 402 is connected to the bottom electrode 102b of the memory element 102; and the other end of the controlling element 402 is connected to the bit line BL. One end of the controlling element 403 is connected to the bottom electrode 103b of the memory element 103; and the other end of the controlling element 403 is connected to the bit line BL. One end of the controlling element 404 is connected to the bottom electrode 104b of the memory element 104; and the other end of the controlling element 404 is connected to the bit line BL.

When the selecting switches 111-114 are turn on and a plus with a higher voltage (also referred to as a high voltage signal) as well as a plus with a lower voltage (also referred to as a low voltage signal) are applied (provided) to the memory elements 101-104 of the cell string 450, resistance CDFs (not shown) and conductance CDFs of the memory elements 101-104 can be obtained.

Figure 5:
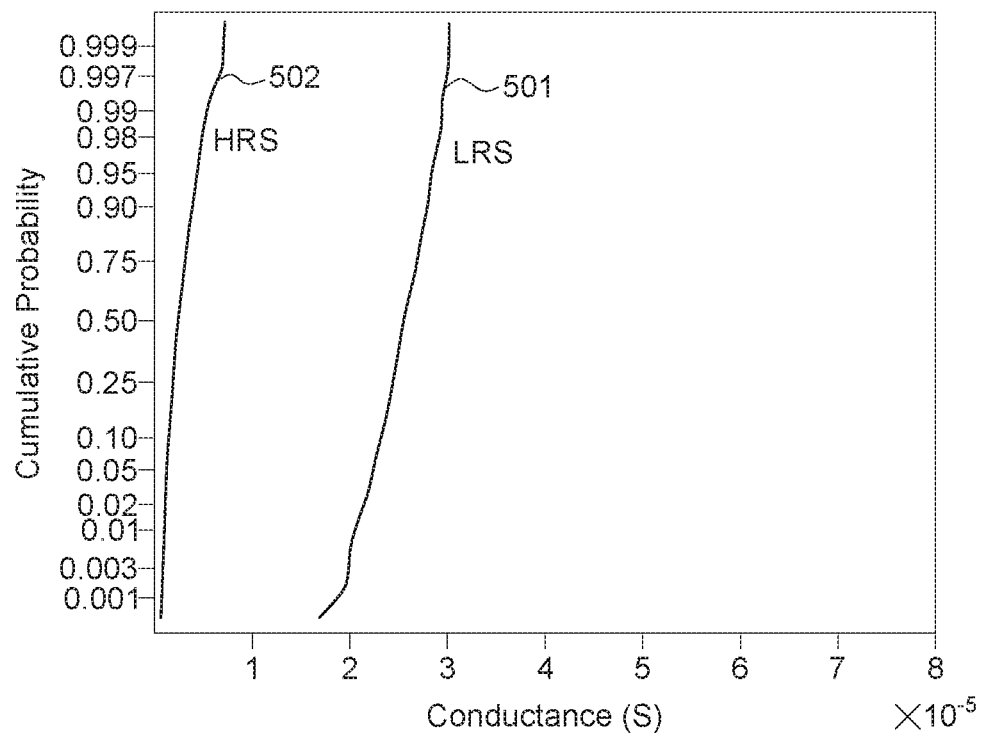
FIG. 5 is a diagram illustrating a conductance CDF of a single memory element constituting the multi-state memory device as depicted in FIG. 4 after the memory cells of the multi-state memory device are subjected to a first signal with a higher constant-voltage and a second signal with a lower constant-voltage.

For example, FIG. 5 is a diagram illustrating a conductance CDF of a single memory element (such as the memory element 101) constituting the multi-state memory device 400 as depicted in FIG. 4 after the memory cells 431-434 of the multi-state memory device 400 are subjected to a first signal with a higher constant-voltage and a second signal with a lower constant-voltage. When the memory element 101 subjected to (receiving) the high voltage pulse (the high voltage signal), a plurality of resistances can be measured and gathered in a higher resistance area HRS (not shown); when the memory element 101 subjected to (receiving) the low voltage pulse (the low voltage signal), a plurality of resistances can be measured and gathered in a lower resistance area LRS (not shown); and the resistance CDF (not shown) of the memory element 101 is then transformed to a conductance CDF as shown in FIG. 5, wherein the curves 501 and 502 respectively represent the conductance cumulative distributions located in the corresponding lower resistance area LRS and the higher resistance area HRS. The stable resistance (the characteristic value) provided by the controlling elements 401-404 can be greater than the resistance located in the lower resistance area LRS and less than the resistance located in the higher resistance area HRS.

When compare FIG. 5 with FIG. 2B, it can be found that the conductance cumulative distributions of the memory element 101 located in the corresponding lower resistance area LRS (the higher conductance area) can be tighten by connecting a controlling element 401 in series to the memory element 101. Similarly, the conductance variation of the other memory elements 102-104 located in the corresponding lower resistance area LRS can be also reduced.

Figure 6:
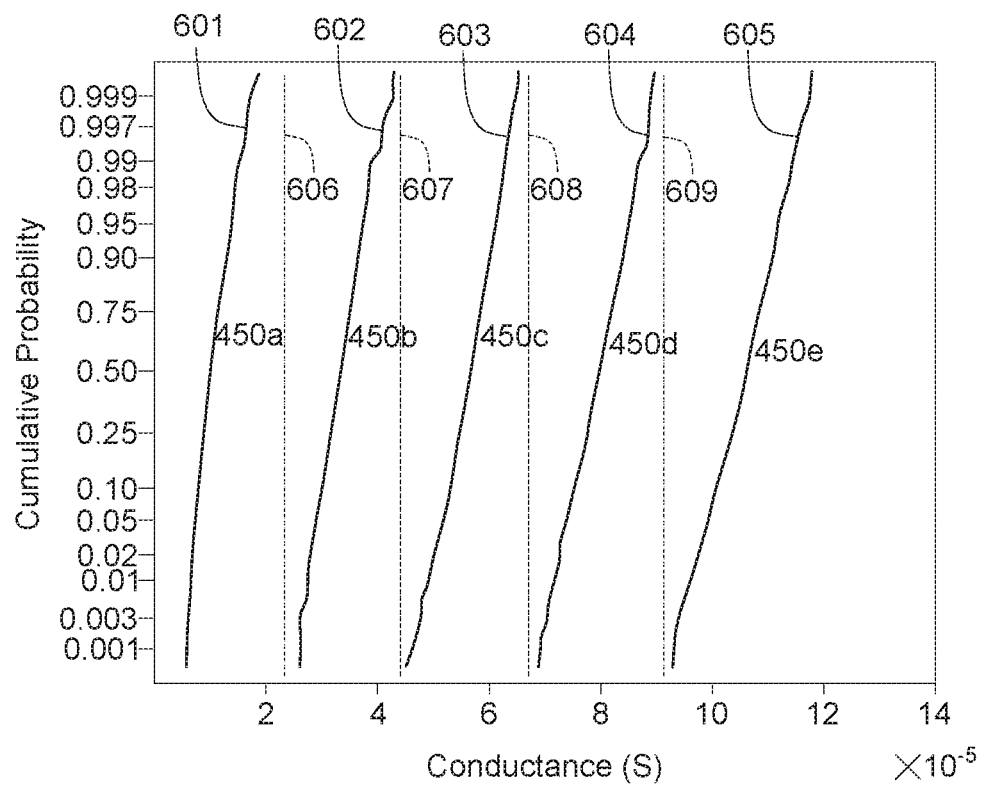
FIG. 6 is a diagram of illustrating sum conductance CDFs of plural cell strings constituted by the memory elements of the multi-state memory device 400 as depicted in FIG. 4 after subjected to an identical voltage pulse.

As described in FIG. 3, the conductance located in the in the corresponding lower resistance area LRS and measured from the memory elements 101-104 disposed in the same cell string, such as the cell string 150a, are sum up to produce a sum conductance CDF. FIG. 6 is a diagram of illustrating sum conductance CDFs of plural cell strings 450a-450e constituted by the memory elements 101-104 of the multi-state memory device 400 as depicted in FIG. 4 after subjected to an identical voltage pulse, wherein the curves 601-605, as shown in FIG. 6, respectively represent the sum conductance cumulative distribution of the cell strings 450a-450e.

According to FIG. 6, it can be found that each of the sum conductance cumulative distribution curves 601-605 is quiet tighten, and there is a gap for separating each two of these curves 601-605, and several critical conductance 606-609 can be determined to indicate different memory-states (i.e. "0" or "1") allowing for data storage. It can be indicated that the memory-states of the memory elements 101-104 constituting the multi-state memory device 400 can be precisely identified by connecting a controlling element (one of the controlling elements 401-404) in series to each of the memory elements 101-104, and the operation reliability of the multi-state memory device 400 thus can be improved.

Figure 7:
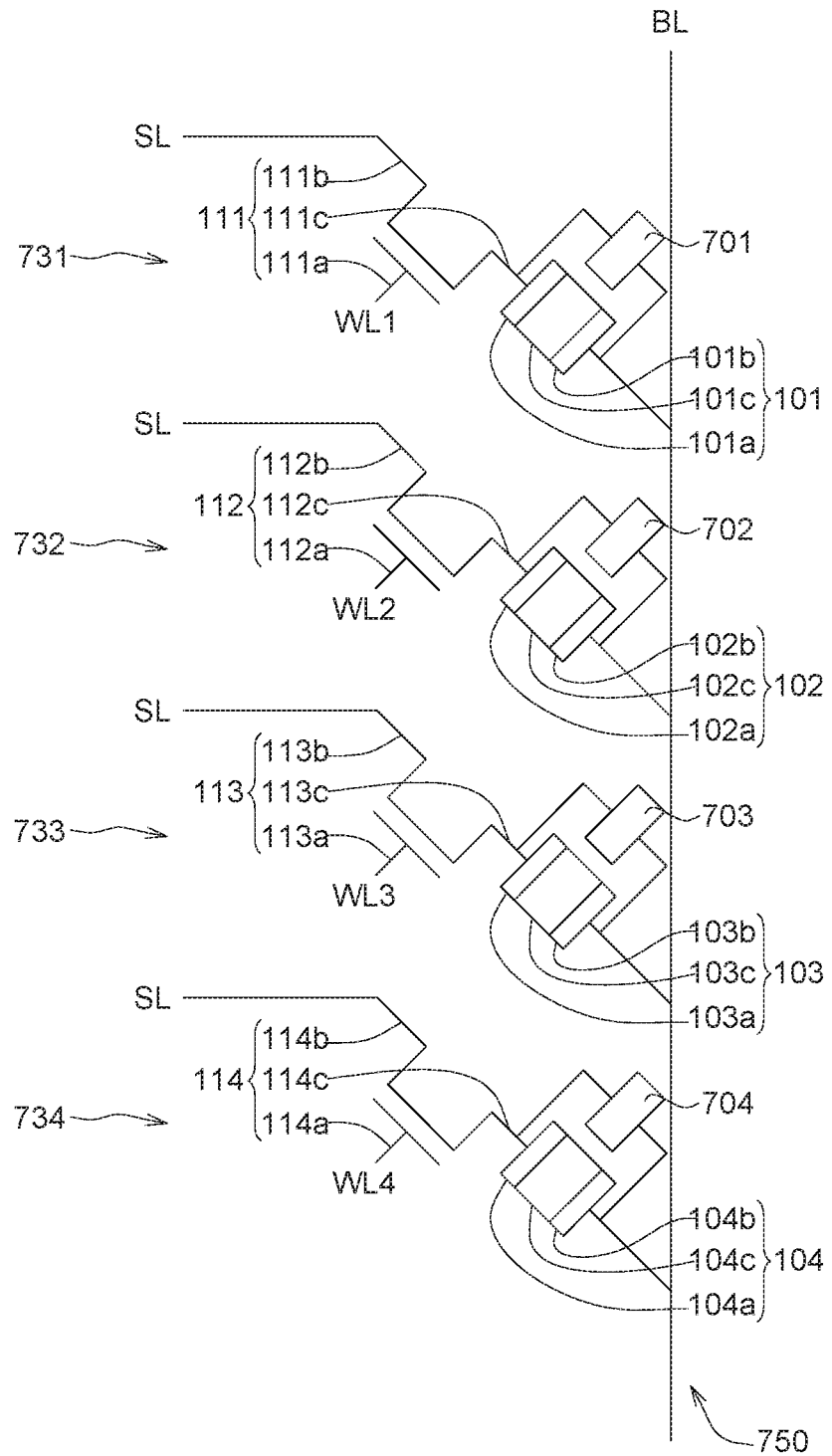
FIG. 7 is a block diagram illustrating a multi-state memory device in accordance with yet another embodiment of the present disclosure.

FIG. 7 is a block diagram illustrating a multi-state memory device 700 in accordance with yet another embodiment of the present disclosure. The structure of the multi-state memory device 700 is similar to that of the multi-state memory device 400 as shown in FIG. 4, except that the structure of the controlling elements 701-404, wherein each of the memory elements 101-104 is corresponding to and connected to one of the controlling elements 701-704 in parallel, rather than in series.

In the present embodiment, the memory element 101 and the controlling element 701 are firstly used to configure a parallel connection structure, and the parallel connection structure is then connected to the selecting switch 111 in series to form a memory cell 731; the memory element 102 and the controlling element 702 firstly used to configure a parallel connection structure, and the parallel connection structure is then connected to the selecting switch 112 in series to form a memory cell 732; the memory element 103 and the controlling element 703 firstly used to configure a parallel connection structure, and the parallel connection structure is then connected to the selecting switch 113 in series to form a memory cell 733; and the memory element 104 and the controlling element 704 firstly used to configure a parallel connection structure, and the parallel connection structure is then connected to the selecting switch 114 in series to form a memory cell 734. These memory cells 731-734 are connected between a bit line BL and a common source line SL to form a cell string 750.

In the present embodiment, each of the controlling elements 701-704 can be a resistor made of doped poly-silicon, and the controlling elements 701-704 have an identical resistance. One end of the controlling element 701 is connected to the top electrode 101a of the memory element 101 and the drain electrode 111c of the selecting switch 111; and the other end of the controlling element 701 is connected to the bottom electrode 101b of the memory element 101 and the bit line BL. One end of the controlling element 702 is connected to the top electrode 102a of the memory element 102 and the drain electrode 112c of the selecting switch 112; and the other end of the controlling element 702 is connected to the bottom electrode 102b of the memory element 102 and the bit line BL. One end of the controlling element 703 is connected to the top electrode 103a of the memory element 103 and the drain electrode 113c of the selecting switch 113; and the other end of the controlling element 703 is connected to the bottom electrode 103b of the memory element 103 and the bit line BL. One end of the controlling element 704 is connected to the top electrode 104a of the memory element 104 and the drain electrode 114c of the selecting switch 114; and the other end of the controlling element 704 is connected to the bottom electrode 104b of the memory element 104 and the bit line BL.

When the selecting switches 111-114 are turn on and a plus with a higher constant-current (also referred to as a high current signal) as well as a plus with a lower constant-current (also referred to as a low current signal) are provided to the memory elements 101-104 of the cell string 750, resistance CDFs of the memory elements 101-104 can be obtained.

Figure 8:
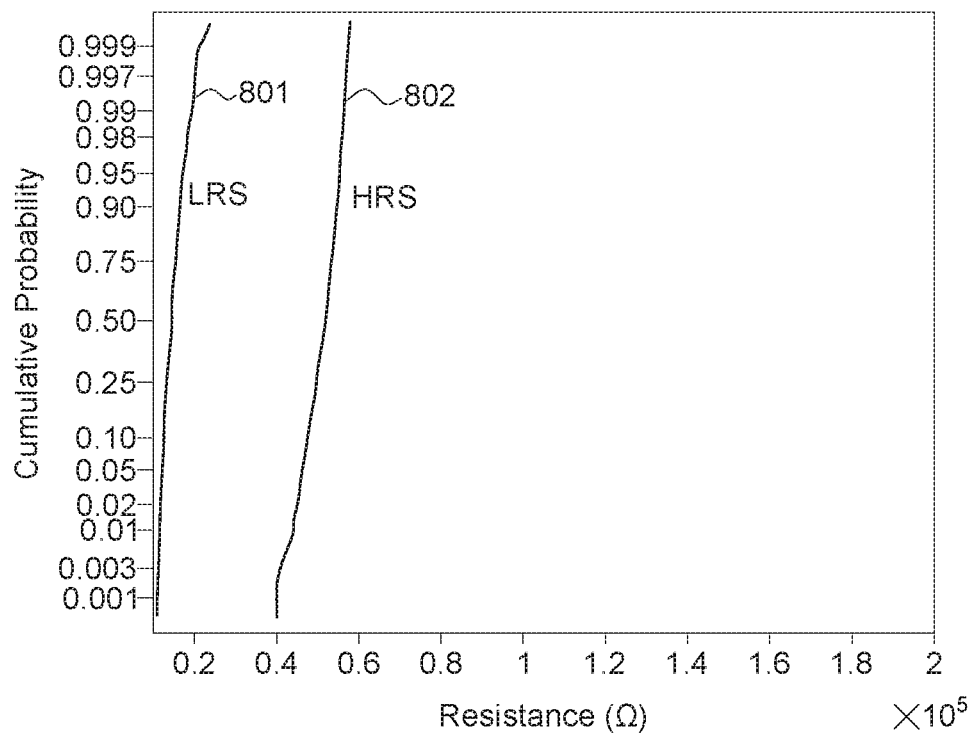
FIG. 8 is a diagram illustrating a resistance CDF of a single memory element constituting the multi-state memory device as depicted in FIG. 7 after subjected to a first signal with a higher constant-current and a second signal with a lower constant-current.

For example, FIG. 8 is a diagram illustrating a resistance CDF of a single memory element (such as the memory element 101) constituting the multi-state memory device 700 as depicted in FIG. 7 after the memory cells 731-734 of the multi-state memory device 700 receiving a first signal with a lower constant-current and a second signal with a higher constant-current. When the memory element 101 receiving the first signal with a lower constant-current, a plurality of resistances can be measured and gathered in a lower resistance area LRS (see the curve 801); when the memory element 101 receiving the second signal with a higher constant-current, a plurality of resistances can be measured and gathered in a higher resistance area HRS (see the curve 802), wherein the stable resistance (the characteristic value) provided by the controlling elements 701-704 can be greater than the resistance located in the lower resistance area LRS and less than the resistance located in the higher resistance area HRS.

When compare FIG. 8 with FIG. 2A, it can be found that the resistance cumulative distributions of the memory element 101 located in the higher resistance area HRS can be tighten by connecting a controlling element 701 in parallel to the memory element 101. Similarly, the resistance variation of the other memory elements 102-104 located in the higher resistance area HRS can be also reduced.

Figure 9:
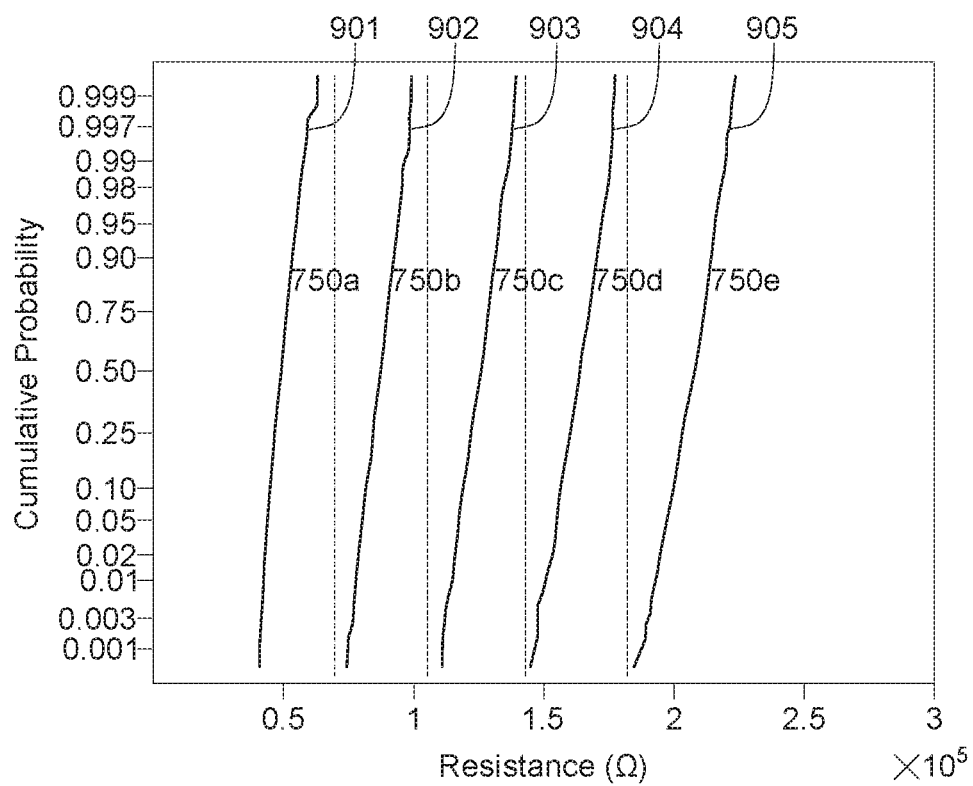
FIG. 9 is a diagram of illustrating a sum resistance CDF of plural memory elements after receiving an identical current signal, in accordance with another embodiment of the present disclosure, wherein these memory elements are disposed in the same cell string of a multi-state memory device and have identical structures and different memory-state characteristics.

The conductance corresponding to the resistance located in the higher resistance area HRS and measured from the memory elements 101-104 disposed in the same cell string, such as the cell string 750a, are sum up to produce a sum conductance CDF. FIG. 9 is a diagram of illustrating sum conductance CDFs of plural cell strings 750a-750e constituted by the memory elements 101-104 of the multi-state memory device 700 as depicted in FIG. 7 after receiving an signal with a constant-current, wherein the curves 901-905, as shown in FIG. 9, respectively represent the sum conductance cumulative distribution of the cell strings 750a-750e.

According to FIG. 9, it can be found that each of the sum conductance cumulative distribution curves 901-905 is quiet tighten, and there is a gap for separating each two of these curves 901-905, and several critical conductance 906-909 can be determined to indicate different memory-states (i.e. "0" or "1") allowing for data storage. It can be indicated that the memory-states of the memory elements 101-104 constituting the multi-state memory device 700 can be precisely identified by connecting a controlling element (one of the controlling elements 701-704) in parallel to each of the memory elements 101-104, and the operation reliability of the multi-state memory device 700 thus can be improved.

It should be appreciated that although the multi-state memory devices 100, 400 and 700 as disclosed in the above embodiments are constituted by a AND-type array, but the type of the multi-state memory deceive is not limited to this regard. In some other embodiments the multi-state memory device may be constituted by a NAND-type array.

Figure 10:
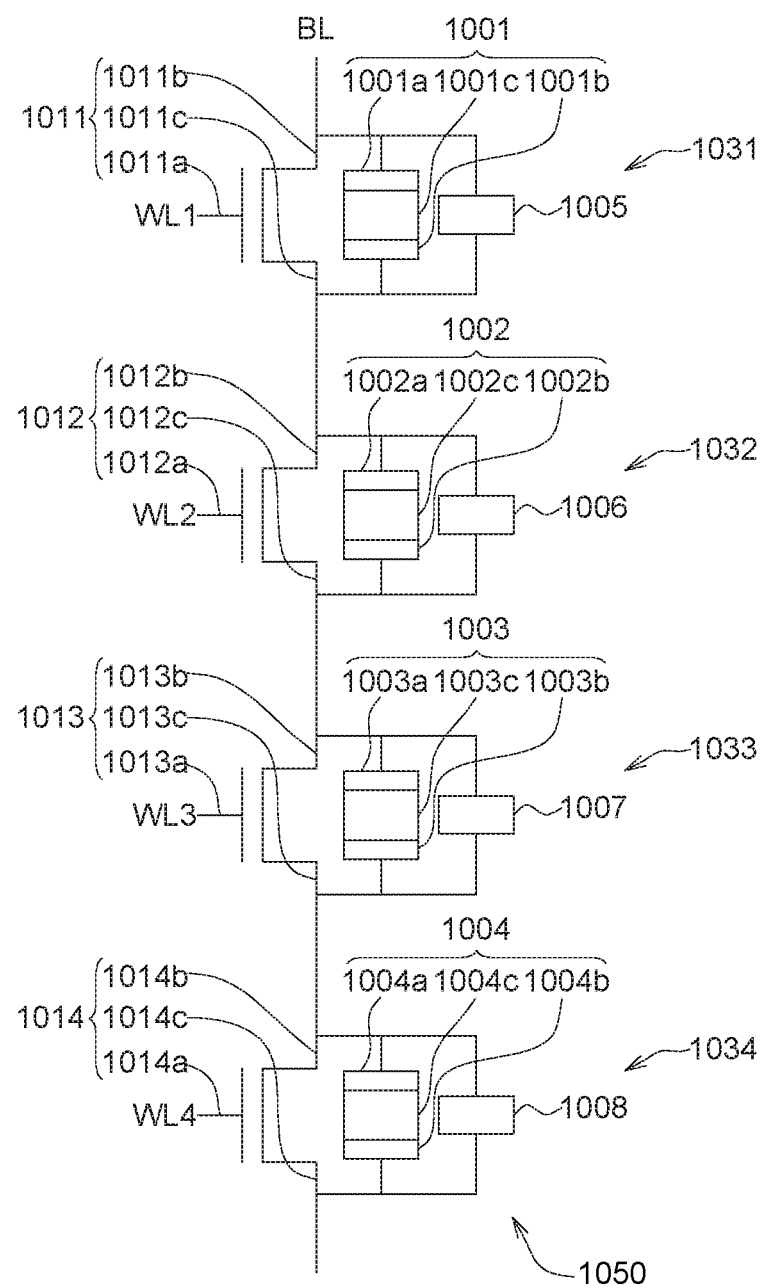
FIG. 10 is a block diagram illustrating a multi-state memory device in accordance with yet another embodiment of the present disclosure.

FIG. 10 is a block diagram illustrating a multi-state memory device 1000 in accordance with yet another embodiment of the present disclosure. The multi-state memory device 1000 includes a plurality of memory elements 1001-1004 with an identical structure, a plurality of selecting switches 1011-1014 with an identical structure and a plurality of controlling elements 1005-1008 with an identical structure.

In some embodiments of the present disclosure, each of the memory elements 1001-1004 may be a ReRAM, a PCM, a MRAM or a STT-RAM. In the present embodiment, the memory elements 1001-1004 can be 4 ReRAM cells.

Each of the selecting switches 111-114 may be a transistor, a diode or as selector. In the present embodiment, the selecting switches 1011-1014 can be made of a MOSFET. Each of the controlling elements 1005-1008 can be made of an electric device (e.g. a transistor, a resistor or a memory device), a parasitic element (e.g. a doped area within a semiconductor substrate) or an insulation structure (e.g. a dielectric structure made of silicon oxide) that can provide a stable resistance. In the present embodiment, each of the controlling elements 1005-1008 can be a resistor made of doped poly-silicon, and the controlling elements 1005-1008 have an identical resistance (also referred to as a characteristic value).

In the present embodiment, the memory element 1001, the selecting switch 1011 and the controlling element 1005 are connected in parallel to form a memory cell 1031; the memory element 1002, the selecting switch 1012 and the controlling element 1006 are connected in parallel to form a memory cell 1032; the memory element 1003, the selecting switch 1013 and the controlling element 1007 are connected in parallel to form a memory cell 1033; and the memory element 1004, the selecting switch 1014 and the controlling element 1008 are connected in parallel to form a memory cell 1034. These memory cells 1031-1034 are connected in series by a bit line BL to form a cell string 1050.

The selecting switch 1011 includes a gate electrode 1011a, a source electrode 1011b and a drain electrode 1011c, wherein the gate electrode 1011a is connected to a word line WL1; the source electrode 1011b is connected to the top electrode 1001a of the memory element 1001 and one end of the controlling element 1005; and the drain electrode 1011c is connected to the bottom electrode 1001b of the memory element 1001 and the other end of the controlling element 1005. The selecting switch 1012 includes a gate electrode 1012a, a source electrode 1012b and a drain electrode 1012c, wherein the gate electrode 1012a is connected to a word line WL2; the source electrode 1012b is connected to the top electrode 1002a of the memory element 1002 and one end of the controlling element 1006; and the drain electrode 1012c is connected to the bottom electrode 1002b of the memory element 1002 and the other end of the controlling element 1006. The selecting switch 1013 includes a gate electrode 1013a, a source electrode 1013b and a drain electrode 1013c, wherein the gate electrode 1013a is connected to a word line WL3; the source electrode 1013b is connected to the top electrode 1003a of the memory element 1003 and one end of the controlling element 1007; and the drain electrode 1013c is connected to the bottom electrode 1003b of the memory element 1003 and the other end of the controlling element 1007. The selecting switch 1014 includes a gate electrode 1014a, a source electrode 1014b and a drain electrode 1014c, wherein the gate electrode 1014a is connected to a word line WL4; the source electrode 1014b is connected to the top electrode 1004a of the memory element 1004 and one end of the controlling element 1008; and the drain electrode 1014c is connected to the bottom electrode 1004b of the memory element 1004 and the other end of the controlling element 1008.

As mentioned above, when the selecting switches 1011-1014 are turn on and a plus with a higher voltage (also referred to as a high voltage signal) as well as a plus with a lower voltage (also referred to as a low voltage signal) are applied (provided) to the memory elements 1001-1004 of the cell string 1050, resistance CDFs (not shown) of the memory elements 1001-1004 can be obtained. When each of the memory elements 1001-1004 subjected to (receiving) the high voltage pulse (the high voltage signal), a plurality of resistances can be measured and gathered in a higher resistance area HRS (not shown); when each of the memory elements 1001-1004 subjected to (receiving) the low voltage pulse (the low voltage signal), a plurality of resistances can be measured and gathered in a lower resistance area LRS (not shown). The stable resistance (the characteristic value) provided by the controlling elements 1005-1008 can be greater than the resistance located in the lower resistance area LRS and less than the resistance located in the higher resistance area HRS.

When compare the resistance CDFs of the memory cells 1031-1034 with the resistance CDFs of the memory cell 131 on which no controlling element connected thereto in parallel (FIG. 2B), it can be found that the resistance cumulative distributions of the memory elements 1001-1004 located in the higher resistance area HRS can be tighten by connecting a controlling element (one of the controlling elements 1005-1008) in parallel to each of the memory elements 1001-1004.

Figure 11:
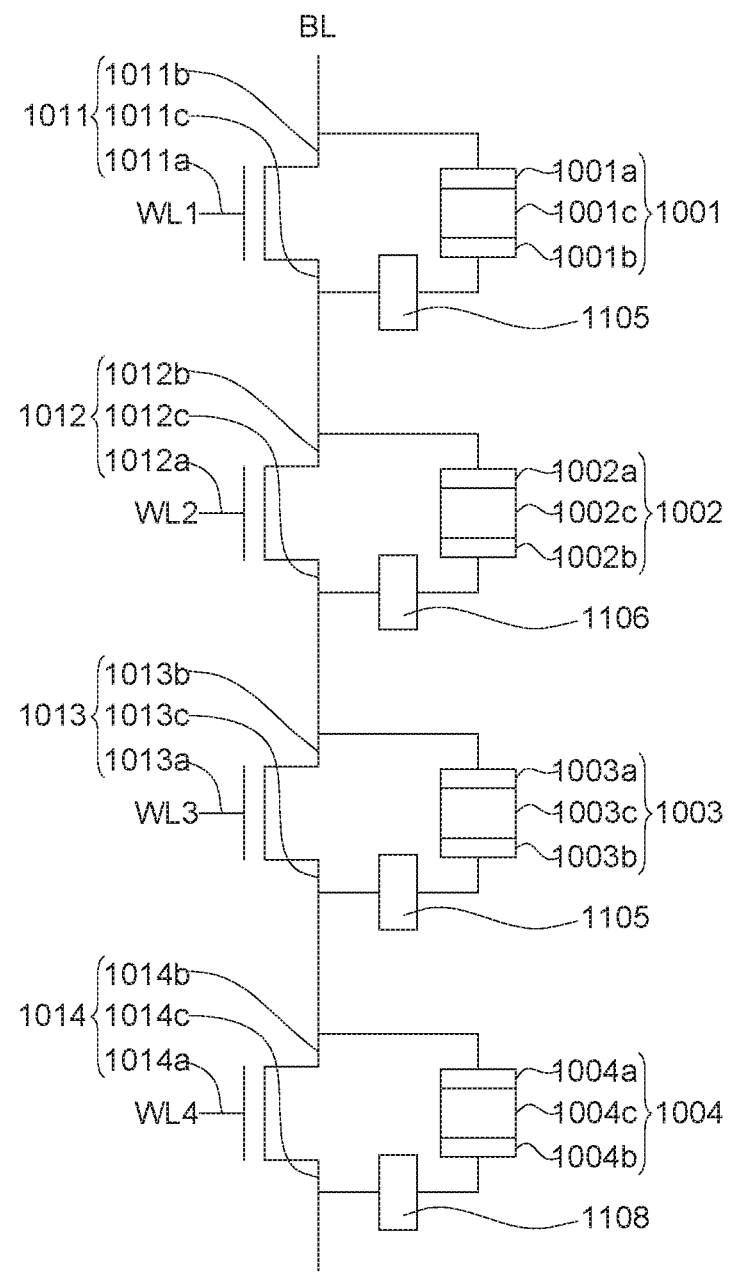
FIG. 11 is a block diagram illustrating a multi-state memory device in accordance with yet another embodiment of the present disclosure.

FIG. 11 is a block diagram illustrating a multi-state memory device 1100 in accordance with yet another embodiment of the present disclosure. The structure of the multi-state memory device 1100 is similar to that of the multi-state memory device 1000 as shown in FIG. 10, except that the structure of the controlling elements 1105-1108, wherein each of the memory elements 1001-1004 is corresponding to and connected to one of the controlling elements 1105-1108 in series, rather than in parallel. Since the other structure of the multi-state memory device 1100 and the method for adjusting the memory state characteristics of the same are disclosed above, thus they will not be redundantly described here.

The memory elements may be the memory cells which can use the Vth measured there from to serve as its memory-state values (designate as "0" or "1" states of the memory cells). In some embodiments of the present disclosure, each of the memory elements can be a ferroelectric random-access memory (FeRAM), and each of the selecting switches may be a transistor, a diode or as selector.

Figure 12:
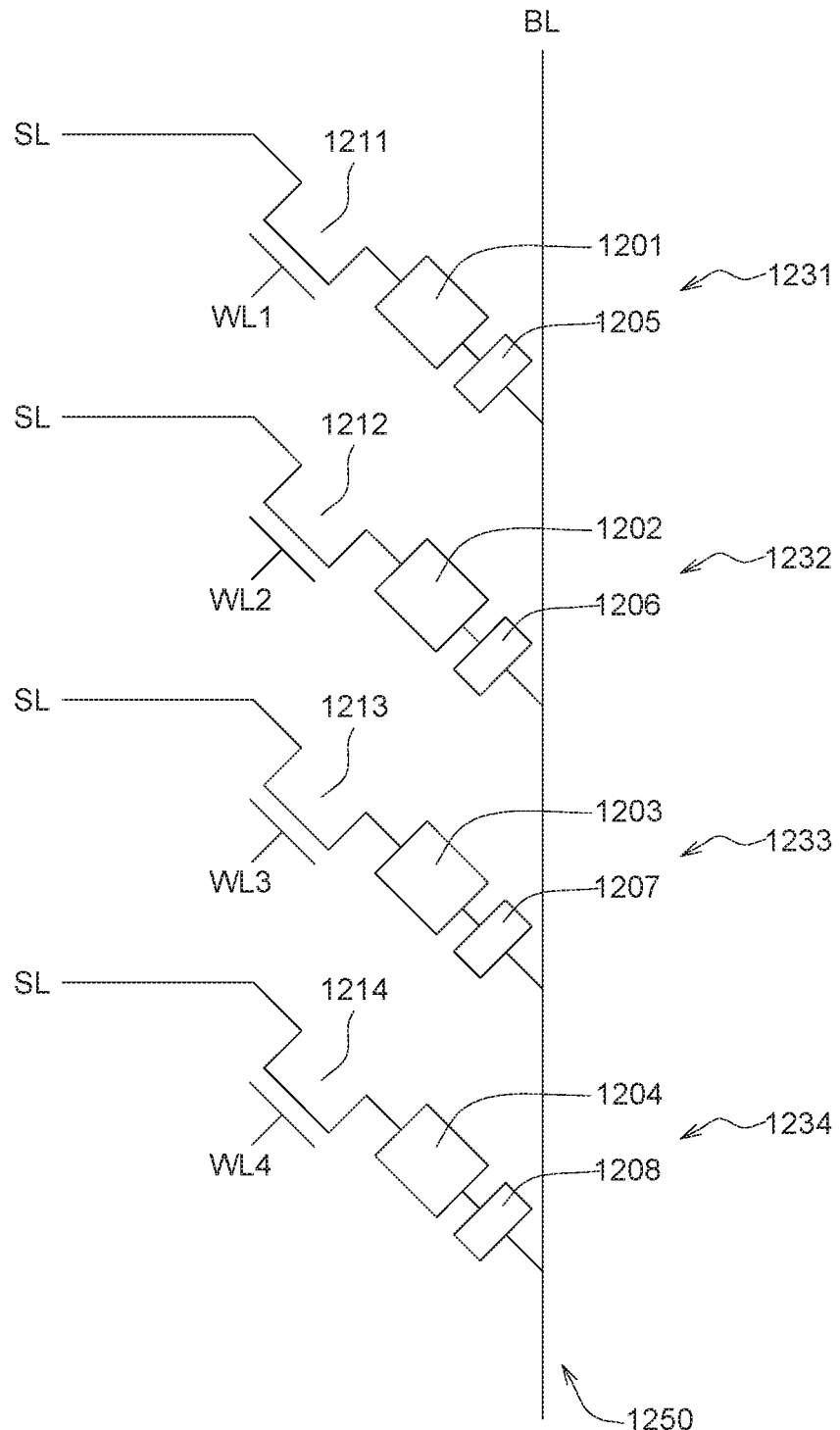
FIG. 12 is a block diagram illustrating a multi-state memory device in accordance with yet another embodiment of the present disclosure.

FIG. 12 is a block diagram illustrating a multi-state memory device 1200 in accordance with yet another embodiment of the present disclosure. The multi-state memory device 1200 includes a plurality of memory elements 1201-1204 with an identical structure, a plurality of selecting switches 1211-1214 with an identical structure and a plurality of controlling elements 1205-1208 with an identical structure. In the present embodiment, each of the memory elements 1201-1204 can be a FeRAM, and each of the selecting switches 1211-1214 can be a diode.

The memory element 1201, the selecting switch 1211 and the controlling element 1205 are connected in series to form a memory cell 1231; the memory element 1202, the selecting switch 1212 and the controlling element 1206 are connected in series to form a memory cell 1232; the memory element 1203, the selecting switch 1213 and the controlling element 1207 are connected in series to form a memory cell 1233; and the memory element 1204, the selecting switch 1214 and the controlling element 1208 are connected in series to form a memory cell 1234. These memory cells 1231-1234 are connected in between a bit line BL and a common source line SL to form a cell string 1250.

As mentioned above, when the selecting switches 1211-1214 are turn on and a plus with a higher voltage (also referred to as a high voltage signal) as well as a plus with a lower voltage (also referred to as a low voltage signal) are applied (provided) to the memory elements 1201-1204 of the cell string 1250, Vth CDFs (not shown) of the memory elements 1201-1204 can be obtained, wherein each Vth CDF of the memory elements 1201-1204 may have a plurality of Vths gathered in a higher Vth area HVth (not shown) and a plurality of Vths gathered in a lower Vth area LVth (not shown). The stable Vth (the characteristic value) provided by the controlling elements 1205-1208 can be greater than the Vths located in the lower Vth area and less than the Vths located in the higher Vth area.

Similarly, when compare the Vth CDFs (not shown) of the memory elements 1201-1204 with the Vth CDF of the memory element on which no controlling element connected thereto in parallel (not shown), it can be found that the Vth cumulative distributions of the memory elements 1201-1204 located in the lower Vth area LVth can be tighten by connecting a controlling element (one of the controlling elements 1205-1208) in series to each of the memory elements 1201-1204. Such that the operation reliability of the multi-state memory device 1200 can thus be improved.

Figure 13:
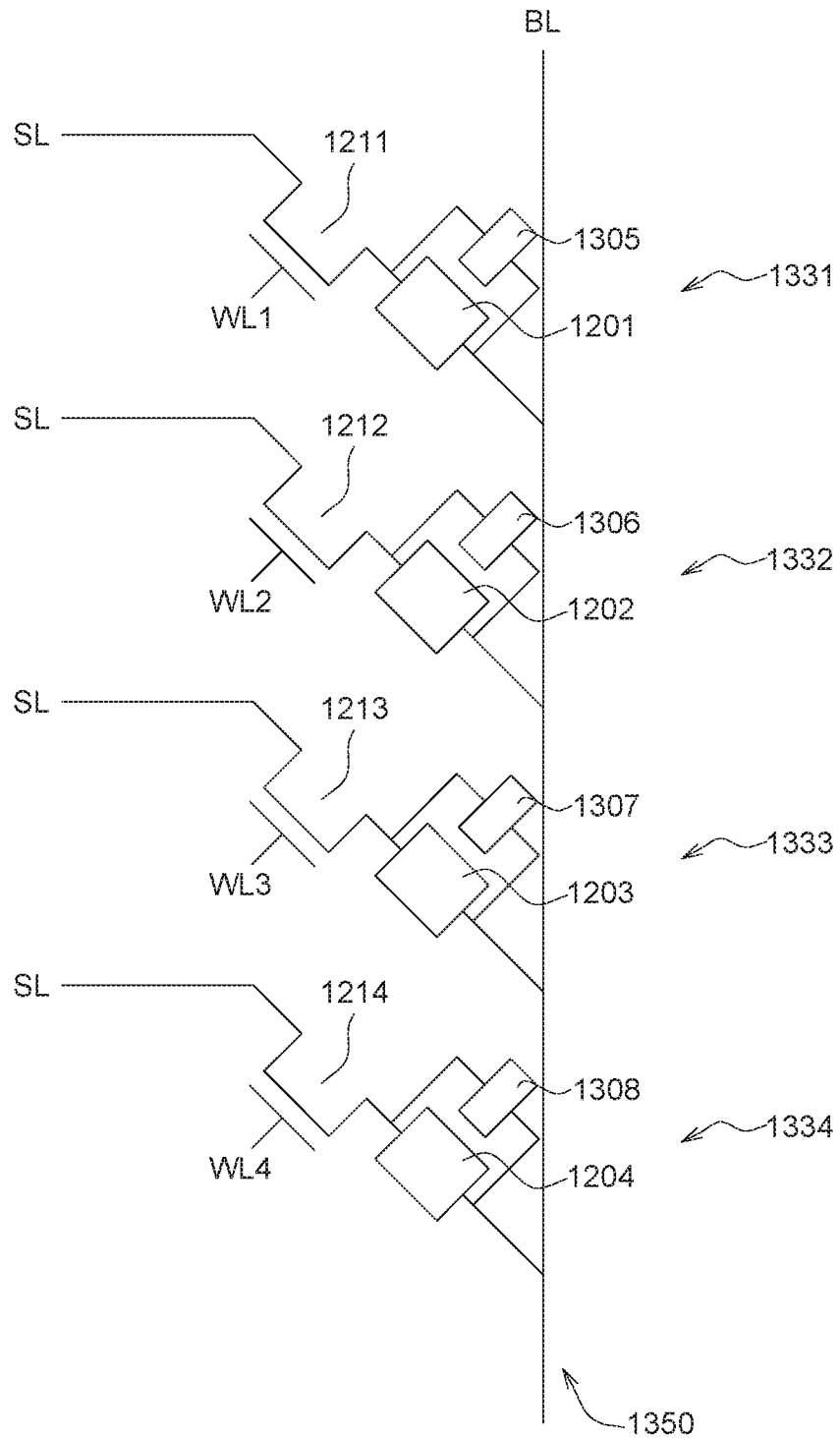
FIG. 13 is a block diagram illustrating a multi-state memory device in accordance with yet another embodiment of the present disclosure.

FIG. 13 is a block diagram illustrating a multi-state memory device 1300 in accordance with yet another embodiment of the present disclosure. The structure of the multi-state memory device 1300 is similar to that of the multi-state memory device 1200 as shown in FIG. 12, except that the structure of the controlling elements 1305-1308, wherein each of the memory elements 1201-1204 is corresponding to and connected to one of the controlling elements 1305-1308 in parallel, rather than in series.

The memory element 1201 and the controlling element 1305 are firstly used to configure a parallel connection structure, and the parallel connection structure is then connected to the selecting switch 1211 in series to form a memory cell 1331; the memory element 1202 and the controlling element 1306 firstly used to configure a parallel connection structure, and the parallel connection structure is then connected to the selecting switch 1212 in series to form a memory cell 1332; the memory element 1203 and the controlling element 1307 firstly used to configure a parallel connection structure, and the parallel connection structure is then connected to the selecting switch 1213 in series to form a memory cell 1333; and the memory element 1204 and the controlling element 1308 firstly used to configure a parallel connection structure, and the parallel connection structure is then connected to the selecting switch 1214 in series to form a memory cell 1334. These memory cells 1331-1334 are connected between a bit line BL and a common source line SL to form a cell string 1350.

When the selecting switches 1211-1214 are turn on and a plus with a higher voltage (also referred to as a high voltage signal) as well as a plus with a lower voltage (also referred to as a low voltage signal) are applied (provided) to the memory elements 1201-1204 of the cell string 1350, Vth CDFs (not shown) of the memory elements 1201-1204 can be obtained, wherein each Vth CDF of the memory elements 1201-1204 may have a plurality of Vths gathered in a higher Vth area HVth (not shown) and a plurality of Vths gathered in a lower Vth area LVth (not shown). The stable Vth (the characteristic value) provided by the controlling elements 1305-1308 can be greater than the Vths located in the lower Vth area and less than the Vths located in the higher Vth area.

Similarly, when compare the Vth CDFs (not shown) of the memory elements 1201-1204 with the Vth CDF of the memory element on which no controlling element connected thereto in parallel (not shown), it can be found that the Vth cumulative distributions of the memory elements 1201-1204 located in the higher Vth area HVth can be tighten by connecting a controlling element (one of the controlling elements 1305-1308) in parallel to each of the memory elements 1201-1204. Such that the operation reliability of the multi-state memory device 1300 can thus be improved.

In accordance with the embodiments of the present disclosure, a multi-state memory device and the method for adjusting the memory state characteristics of the same are provided. Each of the memory elements (memory cells) disposed in the same cell string of the multi-state memory device is electrically connected to a controlling element either in series or in parallel for adjusting the memory-state characteristics generated by the different memory elements to respond an identical signal received by the memory elements, whereby, the variation of the memory-state characteristics can be reduced, and the storage states of the multi-state memory device can be thus precisely identified.

In some embodiments of the present disclosure, the memory-state characteristics may be the resistance, the conductance or the threshold voltage (Vth) of the memory elements. The controlling elements can be resistors with a stable resistance or switches having a stable Vth; and the type of the controlling elements can be determined depending upon the selection of the memory-state characteristics. The connection mode (series or parallel) of the memory elements and the corresponding controlling elements can be selected according to the type, application range, and operation signal of the multiple-state memory device.

For example, in some embodiments of the present disclosure, when the resistance difference of each memory element is designated as the memory-state (e.g. "0" or "1" states) of the memory element for implementing the erase/program operation, a resistor with a stable resistance can be used to serve as the controlling element of the multi-state memory. Each of the memory elements can be connected to one resistor in series for reduce the variation of the conductance (serving as the memory-state characteristics) measured from these memory elements of the multi-state memory in a low resistance state when receiving a constant-voltage as an operation signal. Each of the memory elements can be connected to one resistor in parallel for reduce the variation of the resistance (serving as the memory-state characteristics) measured from these memory elements of the multi-state memory in a high resistance state when receiving a constant-current as an operation signal.

In some embodiments of the present disclosure, when the Vth of each memory element is designated as the memory-state (e.g. "0" or "1" states) of the memory element for implementing the erase/program operation, a switch having a stable Vth can be used to serve as the controlling element of the multi-state memory device. Each of the memory elements can be connected to one switch in series for reduce the variation of the Vths (serving as the memory-state characteristics) measured from these memory elements of the multi-state memory device in a lower Vth state. Each of the memory elements can be connected to one switch in parallel to reduce the variation of the Vths (serving as the memory-state characteristics) measured from these memory elements of the multi-state memory device in a high Vth state.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multi-state memory device, comprising:
    memory cells each comprising a memory element and a controlling element connected to the memory element in series or in parallel, wherein the memory cells are connected in series or in parallel, the controlling elements of the memory cells have a characteristic value, the memory elements have identical structures;
    when one of the memory elements receives a first signal and a second signal respectively, a first state value and a second state value are generated correspondingly, and the characteristic value is greater than the first state value and less than the second state value.

2. The multi-state memory device according to claim 1, wherein the first state value and the second state value are obtained by applying a read signal with a fix plus to the one of the memory elements.

3. The multi-state memory device according to claim 1, wherein each of the controlling elements of the memory cells comprises a resistor with a resistance; and the characteristic value is the resistance of the resistor.

4. The multi-state memory device according to claim 3, wherein the memory elements are selected from a group consisting of a resistive random-access memory (ReRAM), a phase change memory (PCM), a magnetic random-access memory (MRAM) and a spin-transfer torque random-access memory (STT-RAM).

5. The multi-state memory device according to claim 3, wherein both of the first signal and the second signal are a constant-voltage, the resistor is connected to the memory element in series in each of the memory cells.

6. The multi-state memory device according to claim 3, wherein both of the first signal and the second signal are a constant-current, the resistor is connected to the memory element in parallel in each of the memory cells.

7. The multi-state memory device according to claim 1, wherein each of the controlling elements of the memory cells comprises a switch with a threshold voltage (Vth); and the characteristic value is the Vth.

8. The multi-state memory device according to claim 7, wherein each of the memory elements comprises a ferroelectric random-access memory (FeRAM).

9. The multi-state memory device according to claim 7, wherein:
    the first state value has a Vth variation smaller than that of the second state value, the switch is connected to the memory element in series in each of the memory cells; or
    the second state value has a Vth variation smaller than that of the first state value, the switch is connected to the memory element in parallel in each of the memory cells.

10. The multi-state memory device according to claim 1, wherein each of the memory cells further comprising a selecting switch connected to the memory element, wherein the selecting switches of the memory cells are identical to each other.

11. The multi-state memory device according to claim 10, wherein the selecting switches are a transistor, a diode or a selector.

12. The multi-state memory device according to claim 10, wherein each of the selecting switches comprises:
    a gate electrode connected to a word line;
    a source electrode connected to a common source line; and
    a drain electrode connected to a bit line through the memory element and the controlling element.

13. The multi-state memory device according to claim 10, wherein each of the selecting switch comprises:
    a gate electrode connected to a word line;
    a source electrode connected to one end of the memory element; and
    a drain electrode connected to another end of the memory element.

14. The multi-state memory device according to claim 1, comprising a cell string comprising the memory cells connected in series.

15. A method for adjusting memory-state characteristics of a multi-state memory device, comprising:
    providing memory cells each comprising a memory element and a controlling element connected to the memory element in series or in parallel, wherein the memory cells are connected in series or in parallel, the controlling elements of the memory cells have a characteristic value, the memory elements have identical structures when one of the memory elements receives a first signal and a second signal respectively, a first state value and a second state value are generated correspondingly, and the characteristic value is greater than the first state value and less than the second state value.

16. The method according to claim 15, wherein the first state value and the second state value are obtained by applying a read signal with a fix plus to the one of the memory elements.

17. The method according to claim 15, wherein both of the first signal and the second signal are a constant-voltage, each of the controlling elements comprises a resistor with a resistance and connected to the memory element in series; and the characteristic value is substantially equal to each of the resistances of the resistors.

18. The method according to claim 15, wherein both of the first signal and the second signal are a constant-current, each of the controlling elements comprises a resistor with a resistance and connected to the memory element in parallel;

and the characteristic value is substantially equal to each of the resistances of the resistors.

19. The method according to claim 15, wherein the first state value has a Vth variation smaller than that of the second state value, each of the controlling elements comprises a switch with a threshold voltage (Vth) and connected to the memory element in series; or the second state value has the Vth variation smaller than that of the first state value, the each of the controlling elements comprises the switch with the threshold voltage (Vth) and connected to the memory element in parallel, and wherein the characteristic value is substantially equal to each of the threshold voltages (Vth) of the switches.

20. The multi-state memory device according to claim 1, wherein the first signal is a lower constant-current, the first state value is a plurality of resistances in a lower resistance area, the second signal is a higher constant-current, the second state value is a plurality of resistances in a higher resistance area, the characteristic value is a stable resistance greater than the plurality of resistances in the lower resistance area and less than the plurality of resistances in the higher resistance area, the controlling element is connected to the memory element in parallel in each of the memory cells.

21. The method according to claim 15, wherein the first signal is a lower constant-current, the first state value is a plurality of resistances in a lower resistance area, the second signal is a higher constant-current, the second state value is a plurality of resistances in a higher resistance area, the characteristic value is a stable resistance greater than the plurality of resistances in the lower resistance area and less than the plurality of resistances in the higher resistance area, the controlling element is connected to the memory element in parallel in each of the memory cells.

* * * * *